(12) United States Patent
Park et al.

(10) Patent No.: US 7,864,824 B2
(45) Date of Patent: Jan. 4, 2011

(54) MULTIPLE DISTRIBUTED FEEDBACK LASER DEVICES

(75) Inventors: Kyung Hyun Park, Daejeon (KR); Jaeheon Shin, Daejeon (KR); Namje Kim, Daejeon (KR); Chul-Wook Lee, Daejeon (KR); Eundeok Sim, Daejeon (KR); Sang-Pil Han, Daejeon (KR); Yongsoon Baek, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 7 days.

(21) Appl. No.: 12/506,073

(22) Filed: Jul. 20, 2009

(65) Prior Publication Data

US 2010/0142571 A1 Jun. 10, 2010

(30) Foreign Application Priority Data

Dec. 4, 2008 (KR) ........................ 10-2008-0122673
Mar. 27, 2009 (KR) ........................ 10-2009-0026258

(51) Int. Cl.
*H01S 3/04* (2006.01)
(52) U.S. Cl. .................................. 372/34; 372/29.011
(58) Field of Classification Search ................... 385/14; 372/34, 26, 96
See application file for complete search history.

(56) References Cited

U.S. PATENT DOCUMENTS 5,536,085 A * 7/1996 Li et al. ................... 372/50.12
6,349,156 B1 * 2/2002 O'Brien et al. ................ 385/14
7,480,317 B2 * 1/2009 Hu et al. ......................... 372/21
7,489,838 B2 * 2/2009 Kish et al. ..................... 385/14
2005/0242287 A1   11/2005 Hakimi

FOREIGN PATENT DOCUMENTS

| KR | 10-0526999 | 11/2005 |
|---|---|---|
| KR | 10-0799782 | 1/2008 |
| KR | 10-0900320 | 5/2009 |

OTHER PUBLICATIONS

S. Iio et al. "Two-Longitudinal-Mode Laser Diodes", IEEE Photonics Technology Letters, vol. 7, No. 9, Sep. 1995, pp. 959-961.

* cited by examiner

*Primary Examiner*—Minsun Harvey
*Assistant Examiner*—Tuan N. Nguyen
(74) *Attorney, Agent, or Firm*—Rabin & Berdo, P.C.

(57) ABSTRACT

Provided is a multiple distributed feedback laser device. The laser device includes an active layer, a first diffraction grating, and a second diffraction grating. The substrate includes a first distributed feedback region, a modulation region, and a second distributed feedback region. The first diffraction grating is coupled to the active layer in the first distributed feedback region. The second diffraction grating is coupled to the active layer in the second distributed feedback region. In addition, the laser device includes a first micro heater and a second micro heater. The first micro heater supplies heat to the first diffraction grating. The second micro heater supplies heat to the second diffraction grating. The first micro heater and the second micro heater are controlled independently from each other.

13 Claims, 6 Drawing Sheets

MULTIPLE DISTRIBUTED FEEDBACK LASER DEVICES

CROSS-REFERENCE TO RELATED APPLICATIONS

This U.S. non-provisional patent application claims priority under 35 U.S.C. §119 of Korean Patent Application Nos. 10-2008-0122673, filed on Dec. 4, 2008, and 10-2009-0026258, filed on Mar. 27, 2009, the entire contents of which are hereby incorporated by reference.

BACKGROUND OF THE INVENTION

The present invention disclosed herein relates to a laser device, and more particularly, to a multiple distributed feedback laser device.

Semiconductor-based optical devices may be manufactured using semiconductor processes such as a growth process, a photolithography process, and an etching process and/or a deposition process. By using the semiconductor processes, such a semiconductor-based optical device may be miniaturized and mass-produced. In addition, manufacturing costs thereof may be reduced. Accordingly, many researches with respect to the semiconductor-based optical device are being progressed.

Among the semiconductor-based optical devices, functional laser devices, which select specific wavelengths, such as a distributed feedback laser diode and/or a distributed bragg reflector laser diode are being developed. The functional laser devices may filter a wavelength using a diffraction grating. For example, only a lightwave having a specific wavelength corresponding to a bragg wavelength due to a periodic change of a refractive index may be reflected. Thus, the wavelength may be filtered. The reflected lightwave having the specific wavelength may be fed back into a gain region and oscillated. Such a functional laser device may be used as a light source for an optical communication system as well as a light source for generating a terahertz (THz) wave by photomixing.

In a method of generating the THz wave, there are various techniques such as a frequency doubling method, a backward wave oscillator, a photomixing method, carbon dioxide pumping gas laser, quantum cascade laser, and free electron laser. The photomixing method is a method in which beating signals of two laser diodes having wavelengths different from each other are incident onto a photomixer to secure a THz wave of a wavelength corresponding to a beating period thereof. To perform the photomixing method, a frequency of at least one of two laser beams must be stably sequentially tuned. Also, it may be required to accord characteristics of the two laser beams. To secure such a requirement, auxiliary devices are required. Thus, an apparatus of generating the THz wave using the photomixing method may become bigger, and a structure thereof may be complicated. Therefore, manufacturing costs may increase.

SUMMARY OF THE INVENTION

The present invention provides a multiple distributed feedback laser device having superior reliability.

The present invention also provides a highly integrated multiple distributed feedback laser device.

The present invention also provides a multiple distributed feedback laser device which can improve generation efficiency of a terahertz (THz) wave.

In some embodiments, a multiple distributed feedback laser device may include a substrate including a first distributed feedback region, a modulation region, and a second distributed feedback region; an active layer on the substrate in the first distributed feedback, the modulation and the second distributed feedback regions; a first diffraction grating disposed in the first distributed feedback region and coupled to the active layer in the first distributed feedback region; a second diffraction grating disposed in the second distributed feedback region and coupled to the active layer in the second distributed feedback region; a first micro heater supplying heat to the first diffraction grating; and a second micro heater supplying heat to the second diffraction grating. The first micro heater and the second micro heater are controlled independently from each other.

In other embodiments, a refractive index of the first diffraction grating may be changed by the heat supplied from the first micro heater, and a refractive index of the second diffraction grating may be changed by the heat supplied from the second micro heater.

In still other embodiments, a temperature of the heat supplied from the first micro heater to the first diffraction grating may be different from that of the heat supplied from the second micro heater to the second diffraction grating.

In even other embodiments, the multiple distributed feedback laser devices may further include a lower cladding layer between the active layer and the substrate; and an upper cladding layer on the active layer, wherein the lower cladding layer may comprise a compound semiconductor doped with a first-type dopant, and at least upper portion of the upper cladding layer may comprise a compound semiconductor doped with a second-type dopant.

In yet other embodiments, a first laser current may be supplied to the active layer in the first distributed feedback region to oscillate a first light source having a first wavelength, and a second laser current may be supplied to the active layer in the second distributed feedback region to oscillate a second light source having a second wavelength. A reverse bias may be applied to the upper cladding layer, the active layer, and the lower cladding layer in the modulation region to cause an electro absorption phenomenon within the modulation region.

In further embodiments, the first and second diffraction gratings may be disposed in the upper cladding layer.

In still further embodiments, the multiple distributed feedback laser devices may further include a first separate confinement hetero layer between the lower cladding layer and the active layer, the first separate confinement hetero layer having a band gap wavelength less than that of the active layer; and a second separate confinement hetero layer between the upper cladding layer and the active layer, the second separate confinement hetero layer having a band gap wavelength less than that of the active layer.

In even further embodiments, the first micro heater may be disposed over the upper cladding layer of the first distributed feedback region, and the second micro heater may be disposed over the upper cladding layer of the second distributed feedback region. The first and second micro heaters may be electrically insulated from the upper cladding layer.

In yet further embodiments, the multiple distributed feedback laser devices may further include a first electrode electrically connected to the upper cladding layer in the first distributed feedback region; a second electrode electrically connected to the upper cladding layer in the second distributed feedback region; a third electrode electrically connected to the upper cladding layer in the modulation region; a first interlayer dielectric pattern between the first electrode and the first micro heater; and a second interlayer dielectric pattern between the second electrode and the second micro heater.

In yet further embodiments, at least one of the first diffraction grating and the second diffraction grating may include a complex coupled diffraction grating.

In yet further embodiments, the active layer may have a multiple quantum well structure.

In yet further embodiments, the first diffraction grating may have the same period as the second diffraction grating.

In yet further embodiments, the first diffraction grating may have a period different from that of the second diffraction grating.

In yet further embodiments, the first and second diffraction gratings may include compound semiconductors doped with an n-type or p-type dopant, respectively.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout. As used herein, the term "and/or" includes any and all combinations of one or more of the associated listed items.

Figure 1:
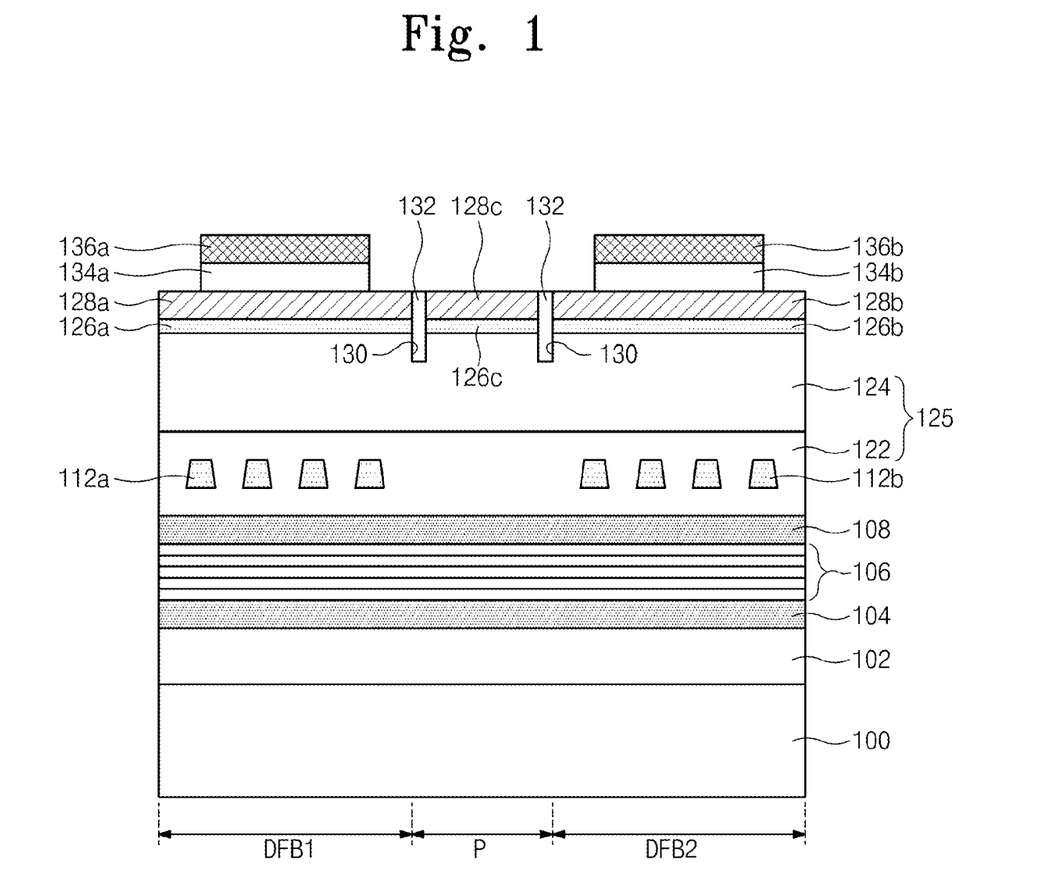
FIG. 1 is a cross-sectional view of a multiple distributed feedback laser device according to an embodiment of the present invention.

FIG. 1 is a cross-sectional view of a multiple distributed feedback laser device according to an embodiment of the present invention.

Referring to FIG. 1, a substrate 100 includes a first distributed feedback region DFB1, a modulation region P and a second distributed feedback region DFB2. An active layer 106 is disposed on the substrate 100. The active layer 106 is disposed in the first distributed feedback, modulation, and second distributed feedback regions DFB1, P, and DFB2 of the substrate 100. The modulation region P may be disposed between the first distributed feedback region DFB1 and the second distributed feedback region DFB2. The substrate 100 may be formed of a compound semiconductor. For example, the substrate 100 may include an indium-phosphorus (InP) substrate.

The active layer 106 may be continuously disposed along the first distributed feedback, modulation, and second distributed feedback regions DFB1, P, and DFB2 of the substrate 100. The active layer 106 may be formed of a compound semiconductor. The active layer 106 may have a multiple quantum well structure. For example, a first InGaAsP layer (well) and a second InGaAsP layer (barrier), which have band gaps different from each other, may be alternately stacked to form the active layer 106.

According to an embodiment of the present invention, the active layer 106 may have a bulk shape formed of InGaAsP having a band gap wavelength of about 1.55 μm. The active layer 106 may be in an intrinsic state.

A lower cladding layer 102 may be disposed between the active layer 106 and the substrate 100. The lower cladding layer 102 may be formed of a compound semiconductor doped with a first-type dopant. An upper cladding layer 125 may be disposed on the active layer 106. At least upper portion of the upper cladding layer 125 may be formed of a compound semiconductor doped with a second-type dopant. One of the first-type dopant and the second-type dopant is an n-type dopant, and the other is a p-type dopant. For example, the lower cladding layer 102 may be formed of n-type InP, and the upper cladding layer 125 may be formed of p-type InP. On the other hand, the lower cladding layer 102 may be formed of the p-type InP, and the upper cladding layer 125 may be formed of the n-type InP. For convenience of description in this embodiment, a case in which the lower cladding layer 102 is formed of the n-type InP, and the upper cladding layer 125 is formed of the p-type InP will be described below.

A first separate confinement hetero layer 104 may be disposed between the active layer 106 and the lower cladding layer 102. The first separate confinement hetero layer 104 may be formed of a compound semiconductor having a band gap wavelength less than that of the active layer 106. For example, the first separate confinement hetero layer 104 may be formed of InGaAsP having a band gap wavelength of about 1.3 μm. A second separate confinement hetero layer 108 may be disposed between the active layer 106 and the upper cladding layer 125. The second separate confinement hetero layer 108 may be formed of a compound semiconductor having a band gap wavelength less than that of the active layer 106. For example, the second separate confinement hetero layer 108 may be formed of InGaAsP having a band gap wavelength of about 1.3 μm. Each of the first and second separate confinement hetero layers 104 and 108 may have a thickness of about 0.1 μm. However, the present invention is not limited thereto. The first and second separate confinement hetero layers 104 and 108 may have thicknesses different from each other. The first and second separate confinement hetero layers 104 and 108 may be in intrinsic states, respectively.

A first diffraction grating 112a is disposed in the first distributed feedback region DFB1, and a second diffraction grating 112b is disposed in the second distributed feedback region DFB2. A diffraction grating is not disposed in the modulation region P. The first diffraction grating 112a is coupled to the active layer 106 within the first distributed feedback region DFB1, and the second diffraction grating 112b is coupled to the active layer 106 within the second distributed feedback region DFB2. Light emitted from the active layer 106 within the first distributed feedback region DFB1 may be bragg-reflected by the first diffraction grating 112a to oscillate a first light source having a first wavelength.

Light emitted from the active layer 106 within the second distributed feedback region DFB2 may be bragg-reflected by the second diffraction grating 112b to oscillate a second light source having a second wavelength.

The first diffraction grating 112a may be disposed within the upper cladding layer 125 in the first distributed feedback region DFB1, and the second diffraction grating 112b may be disposed within the upper cladding layer 125 in the second distributed feedback region DFB2. In detail, the upper cladding layer 125 may include a first upper cladding layer 122 and a second cladding layer 124, which are sequentially stacked. In this case, the first diffraction grating 112a may be disposed within the first upper cladding layer 122 in the first distributed feedback region DFB1, and the second diffraction grating 112b may be disposed within the first upper cladding layer 122 in the second distributed feedback region DFB2. The second upper cladding layer 124 may be formed of a compound semiconductor doped with the second-type dopant. For example, in case where the lower cladding layer 102 is formed of the n-type InP, the second upper cladding layer 124 may be formed of the p-type InP. The first upper cladding layer 122 surrounding the diffraction gratings 112a and 112b may be formed of an undoped compound semiconductor (for example, undoped InP, etc.). On the other hand, the first upper cladding layer 122 may be formed of a compound semiconductor doped with the second-type dopant (for example, p-type InP, etc.).

The first diffraction grating 112a may have the same period as that of the second diffraction grating 112b. On the other hand, according to an embodiment of the present invention, the first and second diffraction gratings 112a and 112b may have periods different from each other. In addition, shapes of the first and second diffraction gratings 112a and 112b may be equal to or different from each other.

At least one of the first and second diffraction gratings 112a and 112b may include a complex coupled diffraction grating. The first and second diffraction gratings 112a and 112b may be formed of compound semiconductors for complex coupling, respectively. For example, the first and second diffraction gratings 112a and 112b may be formed of InGaAs. The first and second diffraction gratings 112a and 112b may be doped with the n-type dopant or the p-type dopant. However, the present invention is not limited thereto. At least one of the first and second diffraction gratings 112a and 112b may include an index coupled diffraction grating.

A first electrode 128a is electrically connected to the upper cladding layer 125 in the first distributed feedback region DFB1, and a second electrode 128b is electrically connected to the upper cladding layer 125 in the second distributed feedback region DFB2. A third electrode 128c is electrically connected to the upper cladding layer 125 in the modulation region P. The first, second, and third electrodes 128a, 128b, and 128c may be disposed on the upper cladding layer 125 in the first distributed feedback region DFB1, the second distributed feedback region DFB2, and the modulation region P, respectively. The first, second, and third electrodes 128a, 128b, and 128c are spaced from each other by isolation trenches 130. The first, second, and third electrodes 128a, 128b, and 128c may be formed of a metallic material. Isolation-insulation patterns 132 may be disposed in the isolation trenches 130, respectively. That is, the isolation-insulation patterns 132 may be disposed among the first, second, and third electrodes 128a, 128b, and 128c, respectively. The isolation-insulation patterns 132 may be formed of at least one of oxide, nitride, and oxide-nitride, the isolation trench 130 may extend downwardly into an upper portion of the upper cladding layer 125. That is, a bottom surface of the isolation trench 130 may be lower than a top surface of the upper cladding layer 125. Components (e.g., diodes) in the first distributed feedback, modulation, and second distributed feedback regions DFB1, P, and DFB2 may operate independently from each other due to the isolation trenches 130. The isolation trench 130 may have a depth at which the components in the regions DFB1, P, and DFB2 are independently operable. Also, the isolation trench 130 may have a depth at which the oscillated lightwave having the specific wavelength can be minimally coupled. That is, the depth of the isolation trench 130 may be defined in consideration of the independent operations of the components within the regions DFB1, P, and DFB2 and the minimal coupling of the oscillated lightwave.

A first ohmic pattern 126a may be disposed between the first electrode 128a and the upper cladding layer 120 in the first distributed feedback region DFB1. A second ohmic pattern 126b may be disposed between the second electrode 128b and the upper cladding layer 120 in the second distributed feedback region DFB2. A third ohmic pattern 126c may be disposed between the third electrode 128c and the upper cladding layer 120 in the modulation region P. The first, second, and third ohmic patterns 126a, 126b, and 126c may be separated from each other by the isolation-insulation patterns 132. The first, second, and third ohmic patterns 126a, 126b, and 126c may be formed of the same material. For example, the first, second, and third ohmic patterns 126a, 126b, and 126c may be formed of InGaAs.

A first micro heater 136a for supplying heat to the first diffraction grating 112a is disposed in the first distributed feedback region DFB1, and a second micro heater 136b for supplying heat to the second diffraction grating 112b is disposed in the second distributed feedback region DFB2. The first micro heater 136a may be disposed over the upper cladding layer 125 in the first distributed feedback region DFB1. The first micro heater 136a may be electrically insulated from the upper cladding layer 125. The second micro heater 136b may be disposed over the upper cladding layer 125 in the second distributed feedback region DFB2. The second micro heater 136b may be electrically insulated from the upper cladding layer 125. The first and second micro heaters 136a and 136b are controlled independently from each other. A refractive index of the first diffraction grating 112a can be changed due to the heat supplied by the first micro heater 136a. A refractive index of the second diffraction grating 112b can be changed due to the heat supplied by the second micro heater 136b. A temperature of the heat supplied by the first micro heater 136a may be different from that of the heat supplied by the second micro heater 136b. At this time, one of the temperatures of the heat supplied by the first and second micro heaters 136a and 136b may be about 0° C. That is, the fact that the temperatures of the heat supplied by the first and second micro heaters 136a and 136b are different from each other may comprise that one micro heater of the first and second micro heaters 136a and 136b supplies heat having a predetermined temperature, and the other micro heater does not supply heat.

The first and second micro heaters 136a and 136b may supply the heat to the first and second diffraction gratings 112a and 112b using Joule's heat. The first and second micro heaters 136a and 136b may be formed of a material having electrical resistivity. For example, the first and second micro heaters 136a and 136b may be formed of a metal such as chrome (Cr) and gold (Au). According to an embodiment of the present invention, the Cr contained in the first and second micro heaters 136a and 136b may be used as a thermal resistor. According to an embodiment of the present invention, the Au contained in the first and second micro heaters 136a and 136b may be used as a bonding material and/or a thermal resistor. However, the present invention is not limited thereto. The first and second micro heaters 136a and 136b may be formed of different materials having electrical resistivity.

The first micro heater 136a may be disposed over the first electrode 128a. A first interlayer dielectric pattern 134a may be disposed between the first electrode 128a and the first micro heater 136a. The second micro heater 136b may be disposed over the second electrode 128b. A second interlayer dielectric pattern 134b may be disposed between the second electrode 128b and the second micro heater 136b. The first and second micro heaters 136a and 136b may be electrically insulated from the first and second electrodes 128a and 128b by the first and second interlayer dielectric patterns 134a and 134b, respectively. Thus, the first and second micro heaters 136a and 136b and the first and second electrodes 128a and 128b may be controlled independently from each other. The first and second interlayer dielectric patterns 134a and 134b may extend laterally to connect with each other. The first and second interlayer dielectric patterns 134a and 134b may be formed of at least one of oxide, nitride, and oxide-nitride.

A first distributed feedback laser diode may include the lower cladding layer 102, the first separate confinement hetero layer 104, the active layer 106, the second separate confinement hetero layer 108, the first diffraction grating 112a, and the upper cladding layer 125 in the first distributed feedback region DFB1. A second distributed feedback laser diode may include the lower cladding layer 102, the first separate confinement hetero layer 104, the active layer 106, the second separate confinement hetero layer 108, the second diffraction grating 112b, and the upper cladding layer 125 in the second distributed feedback region DFB2. A modulation diode may include the lower cladding layer 102, the first separate confinement hetero layer 104, the active layer 106, the second separate confinement hetero layer 108, and the upper cladding layer 125 in the modulation region P.

A first laser current may be supplied to the active layer 106 in the first distributed feedback laser diode through the first electrode 128a. The first laser current may be supplied to the first electrode 128a by applying a forward bias to the first distributed feedback laser diode. The first laser current may be applied to generate light in the active layer 106 in the first distributed feedback laser diode. The generated light is bragg-reflected by the first diffraction grating 112a to oscillate the first light source having the first wavelength. The first wavelength of the first light source may be changed by a change of a refractive index of the first diffraction grating 112a. For example, the first wavelength of the first light source may be in proportion to the refractive index of the first diffraction grating 112a. A first heater current may be supplied to the first micro heater 136a to supply heat of a first temperature to the first diffraction grating 112a, thereby changing the refractive index of the first diffraction grating 112a. Thus, the first wavelength of the first light source may be changed. That is, the first wavelength of the first light source may be changed by the first heater current supplied to the first micro heater 136a.

A second laser current may be supplied to the active layer 106 in the second distributed feedback laser diode through the second electrode 128b. The second laser current may be supplied to the second electrode 128b by applying a forward bias to the second distributed feedback laser diode. The second laser current may be applied to generate light in the active layer 106 in the second distributed feedback laser diode. The generated light in the second distributed feedback laser diode is bragg-reflected by the second diffraction grating 112b to oscillate the second light source having the second wavelength. The second wavelength of the second light source may be changed by a change of a refractive index of the second diffraction grating 112b. A second heater current may be supplied to the second micro heater 136b to supply heat of a second temperature to the second diffraction grating 112b, thereby changing the refractive index of the second diffraction grating 112b. Thus, the second wavelength of the second light source may be changed. That is, the second wavelength of the second light source may be changed by the second heater current supplied to the second micro heater 136b.

A reverse bias may be applied to the modulation diode through the third electrode 128c. As a result, an electro absorption phenomenon may occur in the modulation diode. Side modes except main oscillation modes of the first and second light sources may be absorbed by modulation diode. As a result, optical losses of the first and second light sources may be minimized. The modulation region P in which the modulation diode is disposed may have a limited width (e.g., a distance between the first and second distributed feedback regions DFB1 and DFB2) to minimize optical losses. For example, the modulation region P may have a width less than about 50 µm.

An operation method of the above-described multiple distributed feedback laser device will now be described. The first and second laser currents are supplied to the first and second distributed feedback laser diodes through the first and second electrodes 128a and 128b, respectively. Thus, the first wavelength of the first light source and the second wavelength of the second light source are oscillated from the first and second distributed feedback laser diodes, respectively. At least one of the first and second micro heaters 136a and 136b may operate to change at least one of the first and second wavelengths of the first and second light sources. As a result, the first and second light source having wavelengths different from each other may be oscillated.

According to an embodiment of the present invention, the second heater current may be supplied to the second micro heater 136b without operating the first micro heater 136a. In this case, the second heater current may be continuously changed. Since the second heater current is changed, the temperature of the heat supplied by the second micro heater 136b may be changed. Also, since the temperature is changed, the refractive index of the second diffraction grating 112b may be changed. As a result, the second wavelength of the second light source is continuously stably changed. According to this embodiment, the multiple distributed feedback laser device may continuously oscillate the first light source having the fixed first wavelength and the second light source having the continuously changed second wavelength. The oscillated first and second light sources may be supplied to the photomixer via a resonator to generate a variable a terahertz (THz) wave.

According to another embodiment of the present invention, the first heater current may be supplied to the first micro heater 136a, and the second micro heater 136b may not operate. In this case, the first heater current may be continuously changed to continuously oscillate the first light source having the continuously changed first wavelength and the second light source having the fixed second wavelength.

According to another embodiment of the present invention, the first heater current may be supplied to the first micro heater 136a, and the second heater current may be supplied to the second micro heater 136b. At this time, the first heater current may be continuously changed, and the second heater current may be continuously changed. As a result, the multiple distributed feedback laser device may continuously oscillate the first light source having the continuously changed first wavelength and the second light source having the continuously changed second wavelength. In this case, the temperatures of the heat generated from the first and second micro heaters 136a and 136b may be different from each other, and thus, the first and second wavelengths of the first and second light sources may be different from each other.

However, the present invention is not limited thereto. The multiple distributed feedback laser device may be used by variously combining the above-described methods according to the requirements of an apparatus in which two light sources are required.

According to the multiple distributed feedback laser device, a wavelength difference between the oscillated first and second light sources may be adjusted by the first and second micro heaters 136a and 136b, which are controlled independently from each other. As a result, the first and second light sources may be more stably oscillated. For example, the first and second light sources may be constituted as one compound resonator to couple the first light source to the second light sources. Thus, phases of the first and second light sources are related to each other, such that a characteristic as if their phase difference is locked may be obtained. In the result, the multiple distributed feedback laser device may more stably oscillate the first and second light sources, and the multiple distributed feedback laser device having superior reliability may be realized. Also, when the THz wave is generated by using the multiple distributed feedback laser device, an oscillation frequency that is a key element of the generation of the THz wave may significantly improve a relative intensity noisy (RIN) of a beat source that has an direct effect on the stable oscillation.

The multiple distributed feedback laser device includes the first distributed feedback laser diode in the first distributed feedback region DFB1, the modulation diode in the modulation region P, and the second distributed feedback laser diode in the second distributed feedback region DFB2 on one of the substrate 100. Thus, the highly integrated multiple distributed feedback laser device may be realized.

In addition, the first wavelength of the first light source and the second wavelength of the second light source may be changed by a period change of the first diffraction grating 112a and a period change of the second diffraction grating 112b, respectively. Thus, a wavelength difference between the first and second light sources can be further accurately controlled by the adjusted periods of the diffraction gratings 112a and 112b and the operation of the micro heaters 136a and 136b.

Furthermore, the active layer 106 is disposed in the modulation region P as well as the distributed feedback regions DFB1 and DFB2. That is, the active layer 106 is continuously disposed in the distributed feedback regions DFB1, the modulation region P and DFB2 of the substrate 100. Thus, the first and second light sources having a coherent characteristic may be continuously oscillated. As a result, since the THz wave is generated using the first and second light sources having the coherent characteristic, a THz wave having a very stable and superior characteristic may be generated.

At least one of the diffraction gratings 112a and 112b may include the complex coupled diffraction grating. Thus, an output having a very high modulation index may be obtained. As a result, generation efficiency of the THz wave generated using the first and second light sources may be very high.

A method of forming a multiple distributed feedback laser device according to an embodiment of the present invention will be described with reference to accompanying drawings.

FIGS. 2A to 2H are cross-sectional views illustrating a method of forming a multiple distributed feedback laser device according to an embodiment of the present invention.

Figure 2A:
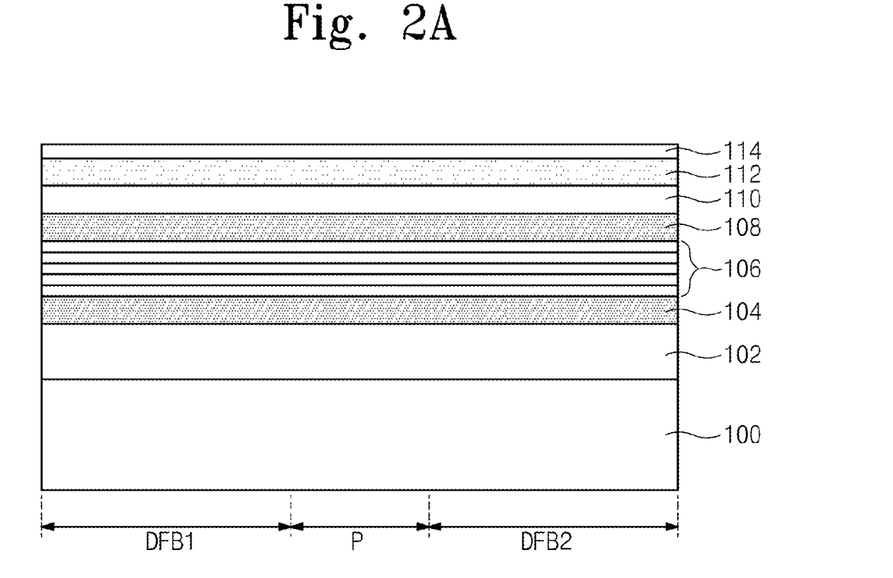
FIGS. 2A to 2H are cross-sectional views illustrating a method of forming a multiple distributed feedback laser device according to an embodiment of the present invention.

Referring to FIG. 2A, a substrate 100 including a first distributed feedback region DFB1, a modulation region P, and a second distributed feedback region DFB2 is prepared. A lower cladding layer 102 may be formed on the substrate 100. The lower cladding layer 102 is formed in the regions DFB1, P, and DFB2 of the substrate 100. The lower cladding layer 102 may be formed of a compound semiconductor doped with a first-type dopant. A first separate confinement hetero layer 104 may be formed on the lower cladding layer 102. An active layer 106 may be formed on the first separate confinement hetero layer 104, and a second separate confinement hetero layer 108 may be formed on the active layer 106. The active layer 106 is formed in the regions DFB1, P, and DFB2 of the substrate 100. Also, the first and second separate confinement hetero layers 104 and 108 are formed in the regions DFB1, P, and DFB2 of the substrate 100.

A first compound semiconductor layer 110 is formed on the second separate confinement hetero layer 108, and a diffraction grating layer 112 is formed on the first compound semiconductor layer 110. The first compound semiconductor layer 10 may be formed of InP. The first compound semiconductor layer 10 may be in an undoped state or doped with a second-type dopant. The diffraction grating layer 112 may be formed of a compound semiconductor for a complex coupled diffraction grating, e.g., InGaAs. The diffraction grating layer 112 may be doped with an n-type dopant or a p-type dopant. On the other hand, the diffraction grating layer 112 may be in an undoped state.

A buffer compound semiconductor layer 114 may be formed on the diffraction grating layer 112. The buffer compound semiconductor layer 114 may be formed of the same material as the first compound semiconductor layer 110.

Figure 2B:
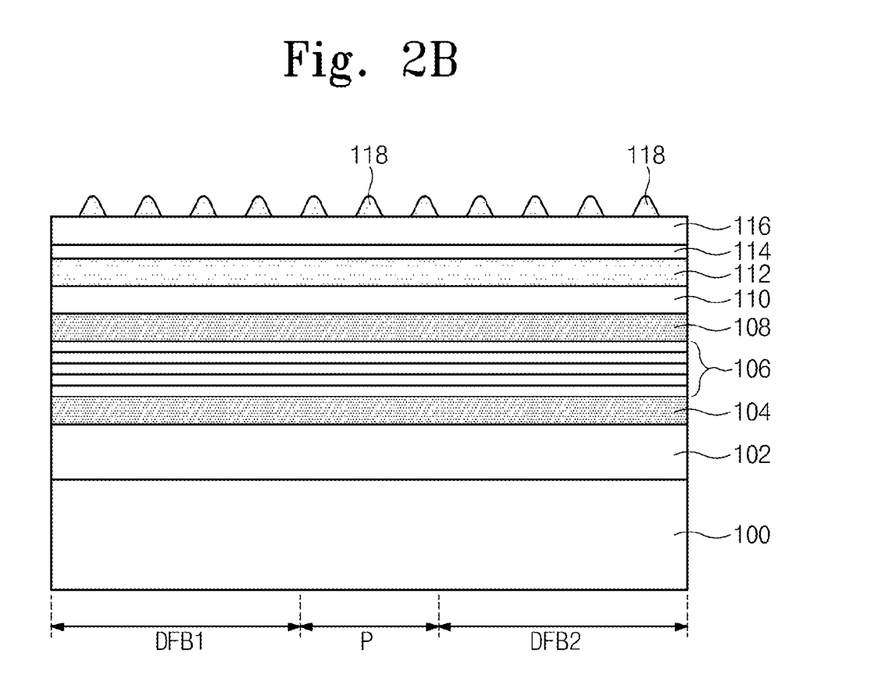

Referring to FIG. 2B, a hard mask layer 116 may be formed on the buffer compound semiconductor layer 114. The hard mask layer may be formed of at least one of nitride, oxide, and oxide-nitride.

A photoresist may be coated on the hard mask layer 116, and the coated photoresist may be patterned to form photoresist patterns 118. The photoresist may be patterned by a holographic system or an electron beam lithography system to form the photoresist patterns 118. Diffraction gratings may be defined by the photoresist patterns. Periods of the photoresist patterns 118 may be adjusted to adjust periods of the diffraction gratings.

Figure 2C:
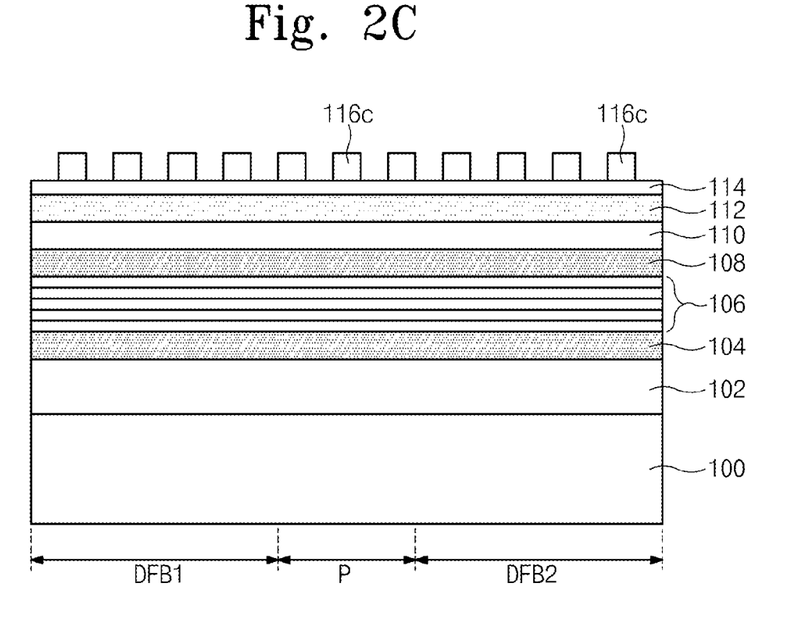

Referring to FIG. 2C, the hard mask layer 116 may be patterned using the photoresist patterns as an etch mask to form hard mask patterns 116a. The hard mask layer 116 may be etched using a magnetically enhanced reactive ion etching process. Then, the photoresist patterns 118 may be removed.

Figure 2D:
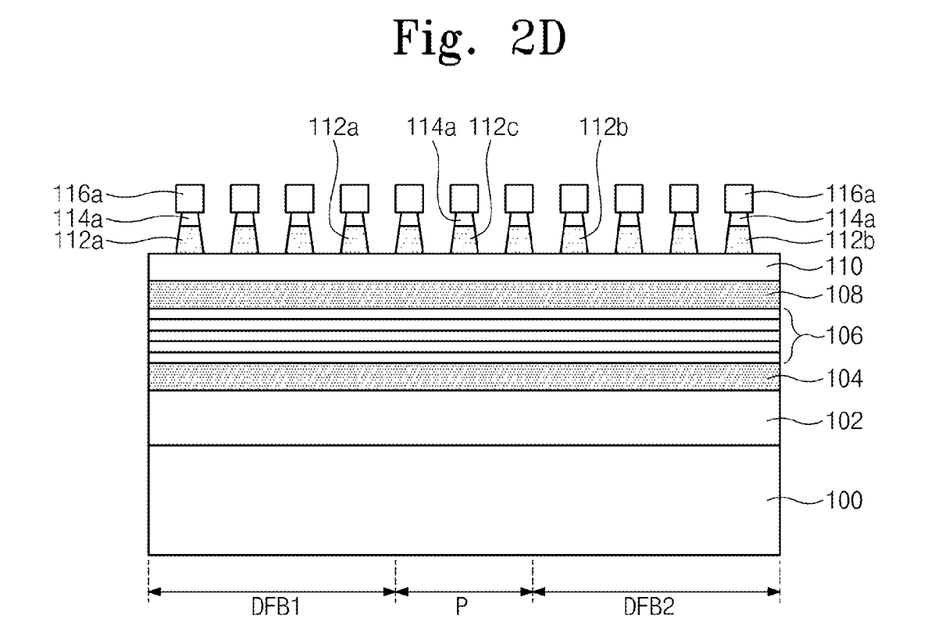

Referring to FIG. 2D, the buffer compound semiconductor layer 114 and the diffraction grating layer 112 are etched using the hard mask patterns 116a as an etch mask. As a result, a first diffraction grating 112a is formed in the first distributed feedback region DFB1, and a second diffraction grating 112b is formed in the second distributed feedback region DFB2. At this time, a remnant grating 112c may be formed in the modulation region P. Buffer compound semiconductor patterns 114a may be formed on the gratings 112a, 112b, and 112c. The etching process that uses the hard mask patterns 116a as the etch mask may include an isotropic etching process (e.g., a wet etching process) and/or a dry etching process.

Figure 2E:
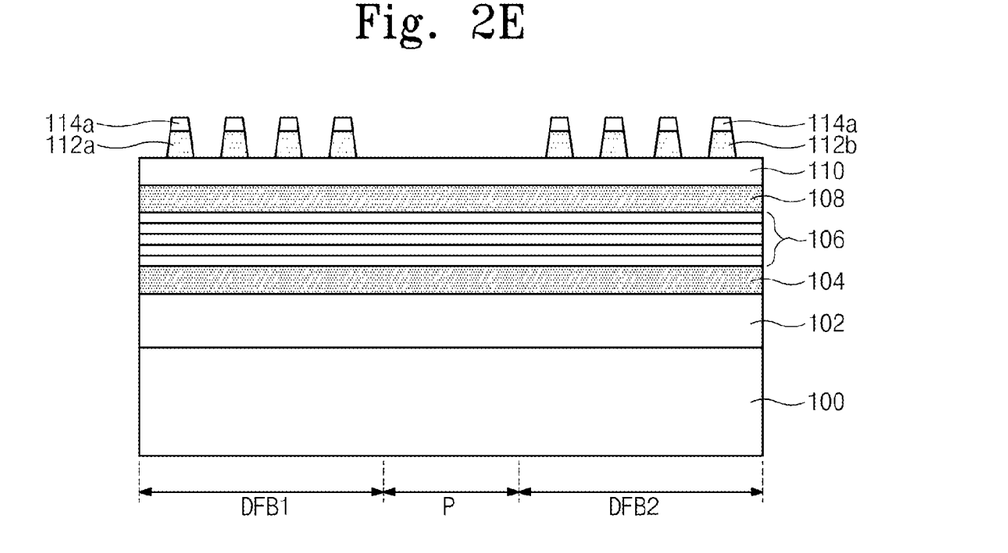

Referring to FIG. 2E, the hard mask patterns 116a are removed. The remnant grating 112c in the modulation region P and the buffer compound semiconductor patterns 114a on the remnant grating 112c are removed. At this time, the first and second diffraction gratings 112a and 112b in the first and second distributed feedback regions DFB1 and DFB2 and the buffer compound semiconductor patterns 114a on the first and second diffraction gratings 112a and 112b remain. A photolithography process may be performed using a mask pattern (not shown) to selectively remove the remnant grating 112c.

Figure 2F:
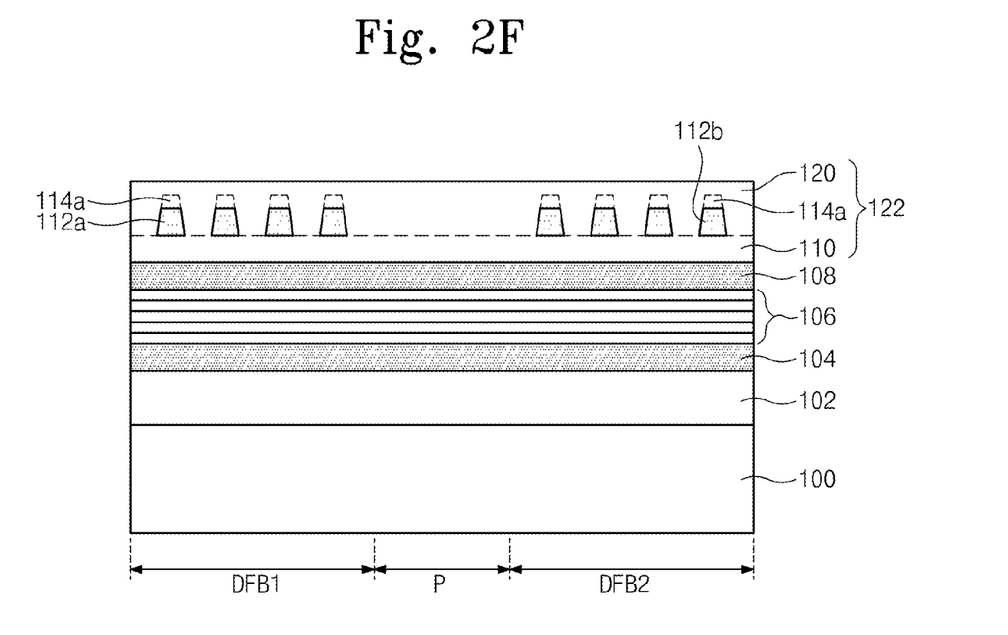

Referring to FIG. 2F, a second compound semiconductor layer 120 may be formed on the substrate 100. The second compound semiconductor layer 120 may be in an undoped state or doped with a second-type dopant. The second compound semiconductor layer 120 may be formed of the same material as the first compound semiconductor layer 110. A metal organic chemical vapor deposition process may be performed to form the second compound semiconductor layer 120. The first compound semiconductor layer 110, the buffer compound semiconductor patterns 114a in the first and second distributed feedback regions DFB1 and DFB2, and the second compound semiconductor layer 120 may constitute a first upper cladding layer 122.

Figure 2G:
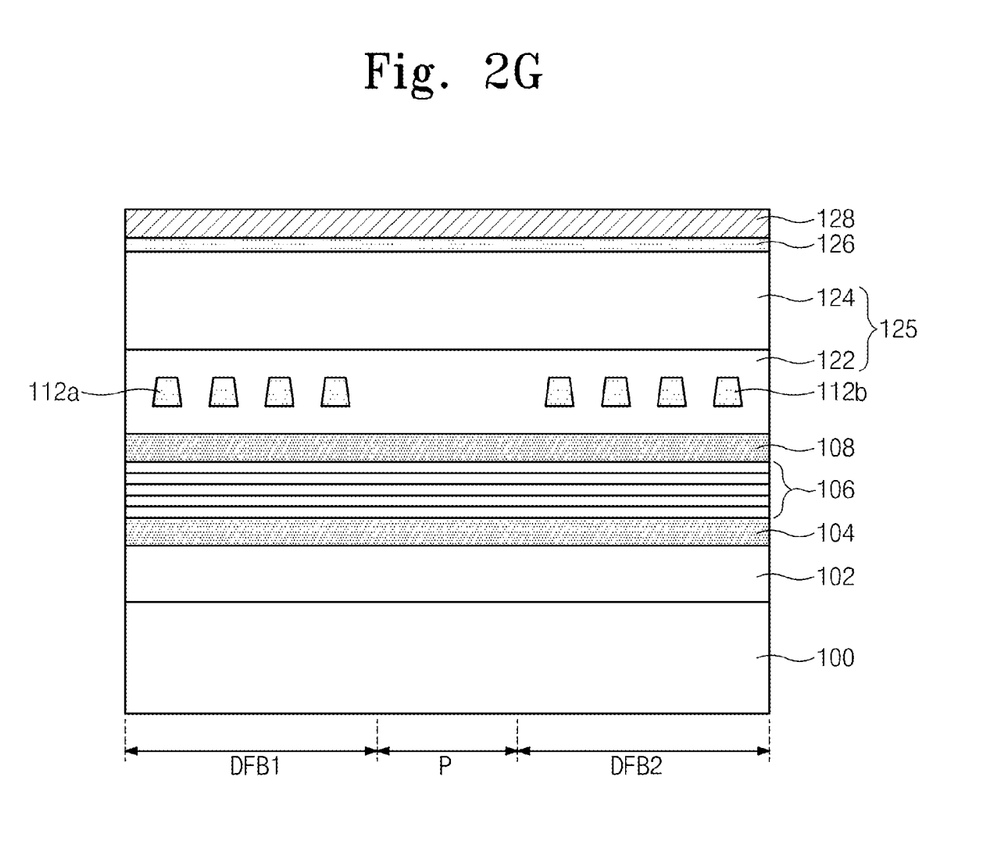

Referring to FIG. 2G, a second upper cladding layer 124 may be formed on the first cladding layer 122. The second upper cladding layer 124 may be formed of a compound semiconductor doped with the second-type dopant. The second upper cladding layer 124 may be formed of the same compound semiconductor as the first upper cladding layer 124. The upper cladding layer may include the first and second upper cladding layers 122 and 124.

An ohmic layer 126 may be formed on the upper cladding layer 125. The ohmic layer 126 may be formed of InGaAs. An electrode layer 128 may be formed on the ohmic layer 126. The electrode layer 128 may be formed of a metal.

Figure 2H:
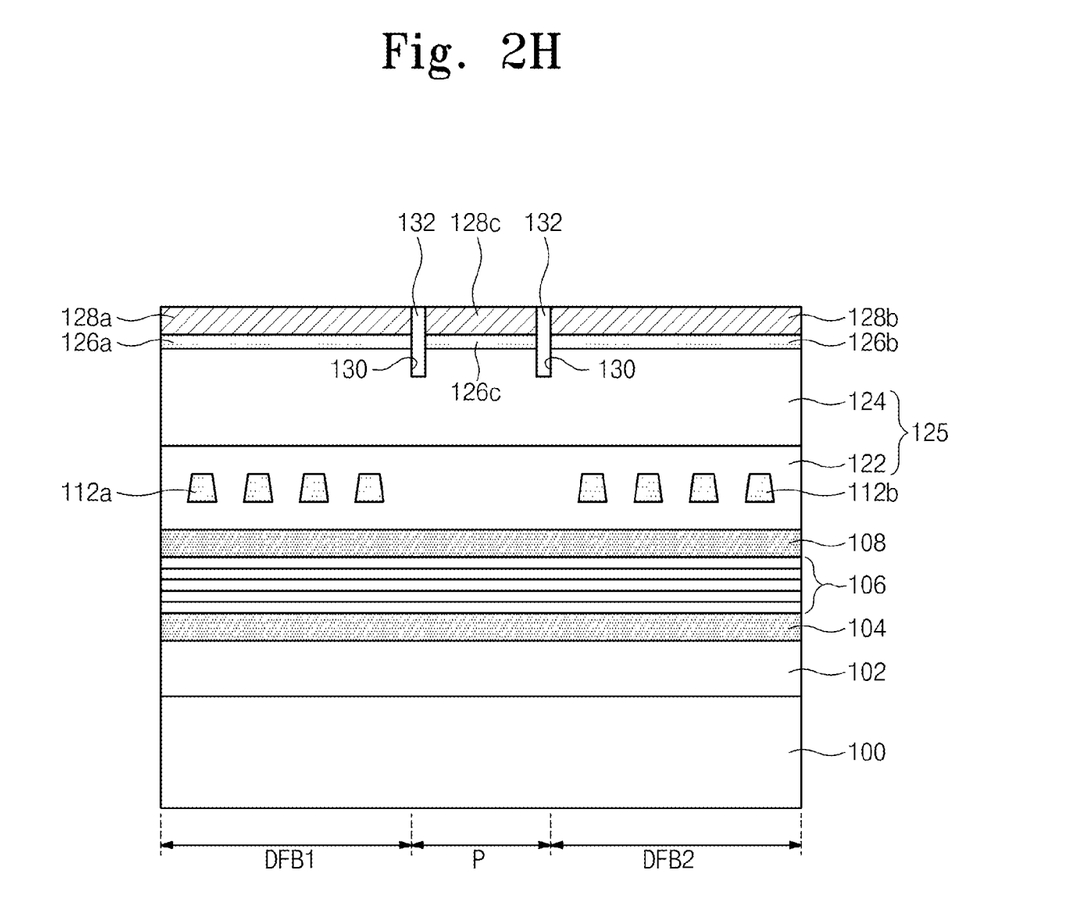

Referring to FIG. 2H, the electrode layer 128, the ohmic layer 126, and the upper cladding layer 125 may be sequentially patterned to form an isolation trench 130. The first distributed feedback laser diode in the first distributed feedback region DFB1, the modulation diode in the modulation region P, and the second distributed feedback laser diode in the second distributed feedback region DFB2 may operate independently from each other by the isolation trench 130. The isolation trench 130 may be formed to form a first ohmic pattern 126a and a first electrode 128a in the first distributed feedback region DFB1, a second ohmic pattern 126b and a second electrode 128b in the second distributed feedback region DFB2, and a third ohmic pattern 126c and a third electrode 128c in the modulation region P. The electrodes 128a, 128b, and 128c are spaced from each other. Also, the ohmic patterns 126a, 126b, and 126c are spaced from each other. An isolation-insulation pattern 132 may be formed in the isolation trench 130.

According to an embodiment of the present invention, before the electrode layer 128 is formed, the ohmic layer 126 and the upper cladding layer 125 may be sequentially patterned to form the isolation trench 130. In this case, after the isolation trench 130 and the isolation-insulation pattern 132 are formed, the electrodes 128a, 128b, and 128c may be formed on the first, second, and third ohmic patterns 126a, 126b, and 126c, which are separated from each other, respectively.

An interlayer dielectric and a heater layer are sequentially formed on the first electrode 128a. The heater layer and the interlayer dielectric may be sequentially patterned to form a first interlayer dielectric pattern 134a and a first micro heater 136a on the first electrode 128a of FIG. 1 and a second interlayer dielectric pattern 134b and a second micro heater 136b on the second electrode 128a. Thus, the multiple distributed feedback laser device of FIG. 1 may be realized.

According to an embodiment of the present invention, the heater layer may be planarized until the interlayer dielectric is exposed to form the first and second micro heaters 136a and 136b.

According to the above-described multiple distributed feedback laser device, the wavelength difference between the oscillated first and second light sources can be adjusted due to the first and second micro heaters, which are controlled independently from each other. As a result, the first and second light sources can be more stably oscillated. Therefore, the multiple distributed feedback laser device having the superior reliability can be realized.

In the multiple distributed feedback laser device, the first distributed feedback region, the modulation region, and the second distributed feedback region are defined in the substrate. The active layer is disposed in the distributed feedback regions as well as the modulation region. That is, the active layer can be successively disposed in the first distributed feedback region, the modulation region, and the second distributed feedback region of the substrate. Thus, the first and second light sources having the coherent characteristic can be sequentially oscillated. For example, since the plurality of distributed feedback laser devices that are individually oscillated is integrated into one resonator, phases of individually oscillated waves can be coupled and related to each other. As a result, a phenomenon in which the phases of the oscillation waves are locked can be induced. Therefore, the very stable multimode oscillation waves that are a key element of the generation of the THz wave can be sequentially generated. In addition, the highly integrated multiple distributed feedback laser device can be realized.

Furthermore, at least one of the diffraction gratings may include the complex coupled diffraction grating. Thus, the output having the very high modulation index can be obtained. As a result, the generation efficiency of the THz wave generated using the first and second light sources can be very high.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A multiple distributed feedback laser device comprising:
   a substrate comprising a first distributed feedback region, a modulation region, and a second distributed feedback region;
   an active layer on the substrate in the first distributed feedback region, the modulation region, and the second distributed feedback region;
   a first diffraction grating disposed in the first distributed feedback region and coupled to the active layer in the first distributed feedback region;
   a second diffraction grating disposed in the second distributed feedback region and coupled to the active layer in the second distributed feedback region;
   a first micro heater supplying heat to the first diffraction grating;
   a second micro heater supplying heat to the second diffraction grating;

a lower cladding layer between the active layer and the substrate; and an upper cladding layer on the active layer, wherein
the first micro heater and the second micro heater are controlled independently of each other,
a first laser current is supplied to the active layer in the first distributed feedback region to oscillate a first light source having a first wavelength,
a second laser current is supplied to the active layer in the second distributed feedback region to oscillate a second light source having a second wavelength, and
a reverse bias is applied in the modulation region to the upper cladding layer, the active layer, and the lower cladding layer, to cause an electro absorption phenomenon within the modulation region.

2. The multiple distributed feedback laser device of claim 1, wherein a refractive index of the first diffraction grating is changed by the heat supplied from the first micro heater, and
a refractive index of the second diffraction grating is changed by the heat supplied from the second micro heater.

3. The multiple distributed feedback laser device of claim 1, wherein a temperature of the heat supplied from the first micro heater to the first diffraction grating is different from that of the heat supplied from the second micro heater to the second diffraction grating.

4. The multiple distributed feedback laser device of claim 1,
wherein the lower cladding layer includes a compound semiconductor doped with a first-type dopant, and at least an upper portion of the upper cladding layer includes a compound semiconductor doped with a second-type dopant.

5. The multiple distributed feedback laser device of claim 4, wherein the first micro heater is disposed over the upper cladding layer in the first distributed feedback region,
the second micro heater is disposed over the upper cladding layer in the second distributed feedback region, and
the first and second micro heaters are electrically insulated from the upper cladding layer.

6. The multiple distributed feedback laser device of claim 1, wherein the first and second diffraction gratings are disposed in the upper cladding layer.

7. The multiple distributed feedback laser device of claim 1, further comprising:
a first separate confinement hetero layer between the lower cladding layer and the active layer, the first separate confinement hetero layer having a band gap wavelength less than that of the active layer; and
a second separate confinement hetero layer between the upper cladding layer and the active layer, the second separate confinement hetero layer having a band gap wavelength less than that of the active layer.

8. The multiple distributed feedback laser device of claim 1, wherein at least one of the first diffraction grating and the second diffraction grating comprises a complex coupled diffraction grating.

9. The multiple distributed feedback laser device of claim 1, wherein the active layer has a multiple quantum well structure.

10. The multiple distributed feedback laser device of claim 1, wherein the first diffraction grating has the same period as the second diffraction grating.

11. The multiple distributed feedback laser device of claim 1, wherein the first diffraction grating has a period different from that of the second diffraction grating.

12. The multiple distributed feedback laser device of claim 1, wherein the first and second diffraction gratings comprise compound semiconductors doped with an n-type or p-type dopant, respectively.

13. A multiple distributed feedback laser device, comprising:
a substrate comprising a first distributed feedback region, a modulation region, and a second distributed feedback region;
an active layer on the substrate in the first distributed feedback region, the modulation region, and the second distributed feedback region;
a first diffraction grating disposed in the first distributed feedback region and coupled to the active layer in the first distributed feedback region.
a second diffraction grating disposed in the second distributed feedback region and coupled to the active layer in the second distributed feedback region;
a lower cladding layer between the active layer and the substrate;
an upper cladding layer on the active layer;
a first micro heater supplying heat to the first diffraction grating, the first micro heater being disposed over the upper cladding layer in the first distributed feedback region;
a second micro heater supplying heat to the second diffraction grating, the second micro heater being disposed over the upper cladding layer in the second distributed feedback region;
a first electrode electrically connected to the upper cladding layer in the first distributed feedback region;
a second electrode electrically connected to the upper cladding layer in the second distributed feedback region;
a third electrode electrically connected to the upper cladding layer in the modulation region;
a first interlayer dielectric pattern between the first electrode and the first micro heater; and
a second interlayer dielectric pattern between the second electrode and the second micro heater,
wherein the first and second micro heaters are controlled independently of each other, and
wherein the first and second micro heaters are electrically insulated from the upper cladding layer.

* * * * *